(12) United States Patent
Cheng

(10) Patent No.: US 10,559,906 B2
(45) Date of Patent: Feb. 11, 2020

(54) SECUREMENT OF SOLDER UNIT UPON CONTACT

(71) Applicants:FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventor: Shan-Yong Cheng, New Taipei (TW)

(73) Assignees: FU DING PRECISION COMPONENT (SHEN ZHEN) CO., LTD., Shenzhen (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 16/170,000

(22) Filed: Oct. 24, 2018

(65) Prior Publication Data

US 2019/0123468 A1 Apr. 25, 2019

(30) Foreign Application Priority Data

Oct. 24, 2017 (CN) .......................... 2017 1 1003629
Oct. 24, 2017 (CN) ...................... 2017 2 1384672 U

(51) Int. Cl.
*H01R 4/02* (2006.01)
*H01R 13/193* (2006.01)
*H05K 7/10* (2006.01)
*H05K 7/02* (2006.01)

(52) U.S. Cl.
CPC ........... *H01R 13/193* (2013.01); *H05K 7/023* (2013.01); *H05K 7/1007* (2013.01); *H01R 4/02* (2013.01)

(58) Field of Classification Search
CPC ........ H01R 13/193; H01R 4/02; H05K 7/023; H05K 7/1007
See application file for complete search history.

(56) References Cited

U.S. PATENT DOCUMENTS 6,095,842 A 8/2000 Hai
6,099,321 A 8/2000 Hai
(Continued)

FOREIGN PATENT DOCUMENTS

CN 2520023 Y 12/2001
CN 2618319 Y 5/2004
(Continued)

*Primary Examiner* — Truc T Nguyen
(74) *Attorney, Agent, or Firm* — Wei Te Chung; Ming Chieh Chang

(57) ABSTRACT

An electronic component includes a first module, a second module and a third module between the first module and the second module. Each of the first module and the second module includes a plurality of conductive pads thereon. A connecting part includes a plate body and a plurality of first tails and a plurality of second tails respectively extending on two opposite sides of the plate body wherein the first tails are soldered upon the first conductive pads and the second tails are soldered upon the second conductive pads, respectively. Each of the first tails and the second tails includes a mounting pad with a through hole therein, and a folded section on the end edge with a solder unit received with a space formed in the folded section and communicatively above the corresponding through hole.

17 Claims, 18 Drawing Sheets

(56) References Cited

U.S. PATENT DOCUMENTS

| | | | |
|---|---|---|---|
| 6,198,634 B1* | 3/2001 | Armezzani | H01L 23/49816 174/255 |
| 6,267,615 B1 | 7/2001 | Hai | |
| 7,959,446 B1* | 6/2011 | Ju | H05K 3/3436 439/71 |
| 2004/0166727 A1* | 8/2004 | Ling | H01M 2/202 439/507 |
| 2005/0250367 A1* | 11/2005 | Scholz | H01R 13/193 439/342 |
| 2005/0260868 A1* | 11/2005 | Lee | H01R 13/2485 439/66 |
| 2006/0258190 A1* | 11/2006 | Chen | H05K 3/3426 439/83 |
| 2006/0270286 A1* | 11/2006 | Zhao | H01M 2/206 439/840 |
| 2007/0020962 A1* | 1/2007 | Yoshida | H01R 12/7005 439/67 |
| 2007/0298624 A1* | 12/2007 | Hougham | H05K 3/326 439/66 |
| 2009/0023330 A1* | 1/2009 | Stoner | H01R 9/096 439/493 |
| 2009/0253301 A1* | 10/2009 | Chang | G06K 7/0021 439/620.22 |
| 2009/0305525 A1* | 12/2009 | Fan | H01R 12/7076 439/69 |
| 2011/0076862 A1* | 3/2011 | Yeh | H01R 13/2457 439/70 |
| 2011/0104958 A1* | 5/2011 | Kwon | H01M 2/105 439/816 |
| 2012/0003879 A1* | 1/2012 | Mason | H01R 12/57 439/752.5 |
| 2016/0315403 A1* | 10/2016 | Xiao | H01R 12/707 |

FOREIGN PATENT DOCUMENTS

| | | |
|---|---|---|
| CN | 2643493 Y | 9/2004 |
| CN | 206401565 U | 8/2017 |

\* cited by examiner

SECUREMENT OF SOLDER UNIT UPON CONTACT

BACKGROUND OF THE DISCLOSURE

1. Field of the Disclosure

The present disclosure relates to the electronic part and the connecting part with the solder unit thereon.

2. Description of Related Arts

The traditional contact equipped with a solder ball can be referred to U.S. Pat. Nos. 6,095,842 and 6,099,321 wherein the undersurface of the contact tail is coated with a layer of solder flux, and the solder unit/ball is attached upon the undersurface of the contact tail via assistance of the solder flux. Anyhow, such arrangement may have defects including contamination of the solder flux upon the contacting section of the contact, and/or the poor securement between the solder unit and the contact tail.

An improved solder unit securement upon the contact tail is desired.

SUMMARY OF THE DISCLOSURE

Accordingly, an object of the present disclosure is to provide an improved securement of the solder unit upon the contact tail.

An electronic component includes a first module, a second module and a third module between the first module and the second module. Each of the first module and the second module includes a plurality of conductive pads thereon. A connecting part includes a plate body and a plurality of first tails and a plurality of second tails respectively extending on two opposite sides of the plate body wherein the first tails are soldered upon the first conductive pads and the second tails are soldered upon the second conductive pads, respectively. Each of the first tails and the second tails includes a mounting pad with a through hole therein, and a folded section on the end edge with a solder unit received with a space formed in the folded section and communicatively above the corresponding through hole. The solder unit includes a tin body or a solder core enclosed within a layer of solder flux. Through this arrangement, the solder not only unit may be reliably secured to the corresponding contact tail before mounting to the corresponding conductive pad, but also can be melted to flow through the through hole and solidified to be soldered upon the conductive pad to efficiently secure the contact tail and the corresponding conductive pad together.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
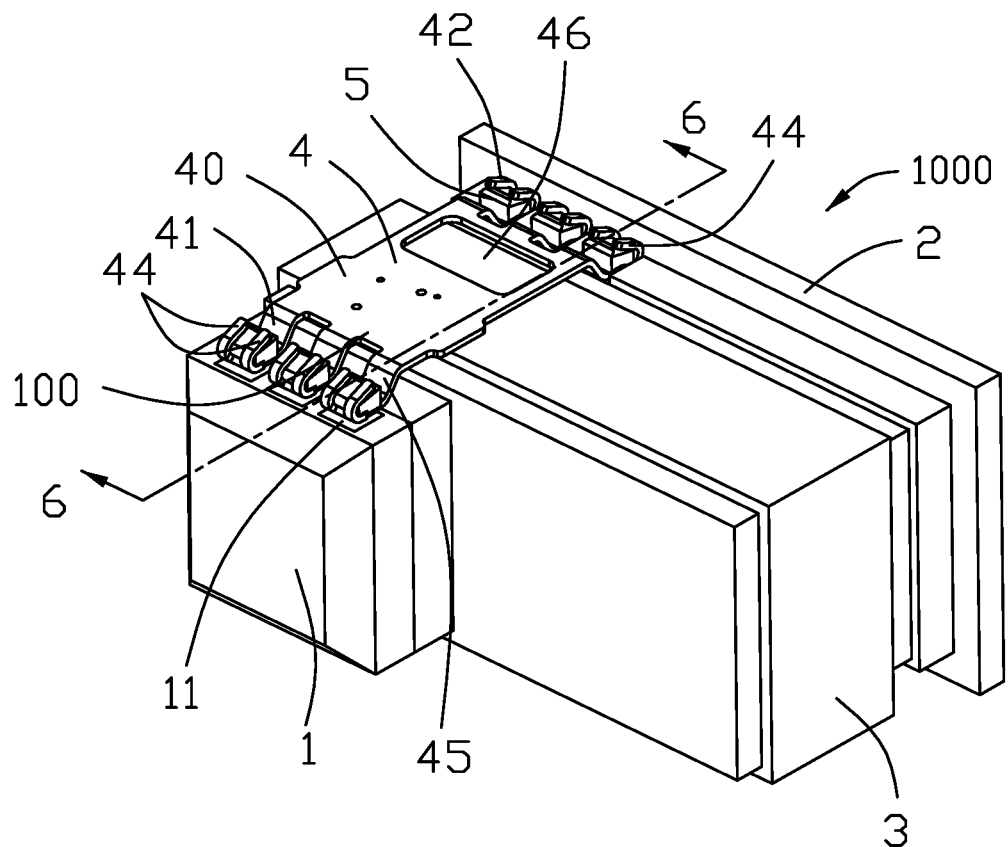
FIG. 1 is an assembled perspective view of the electronic component with the connecting part having the solder unit thereon, according to the first embodiment of the invention.

Reference description will now be made in detail to the embodiment of the present disclosure. The reference numerals are only referred to the related embodiments, respectively.

Figure 2:
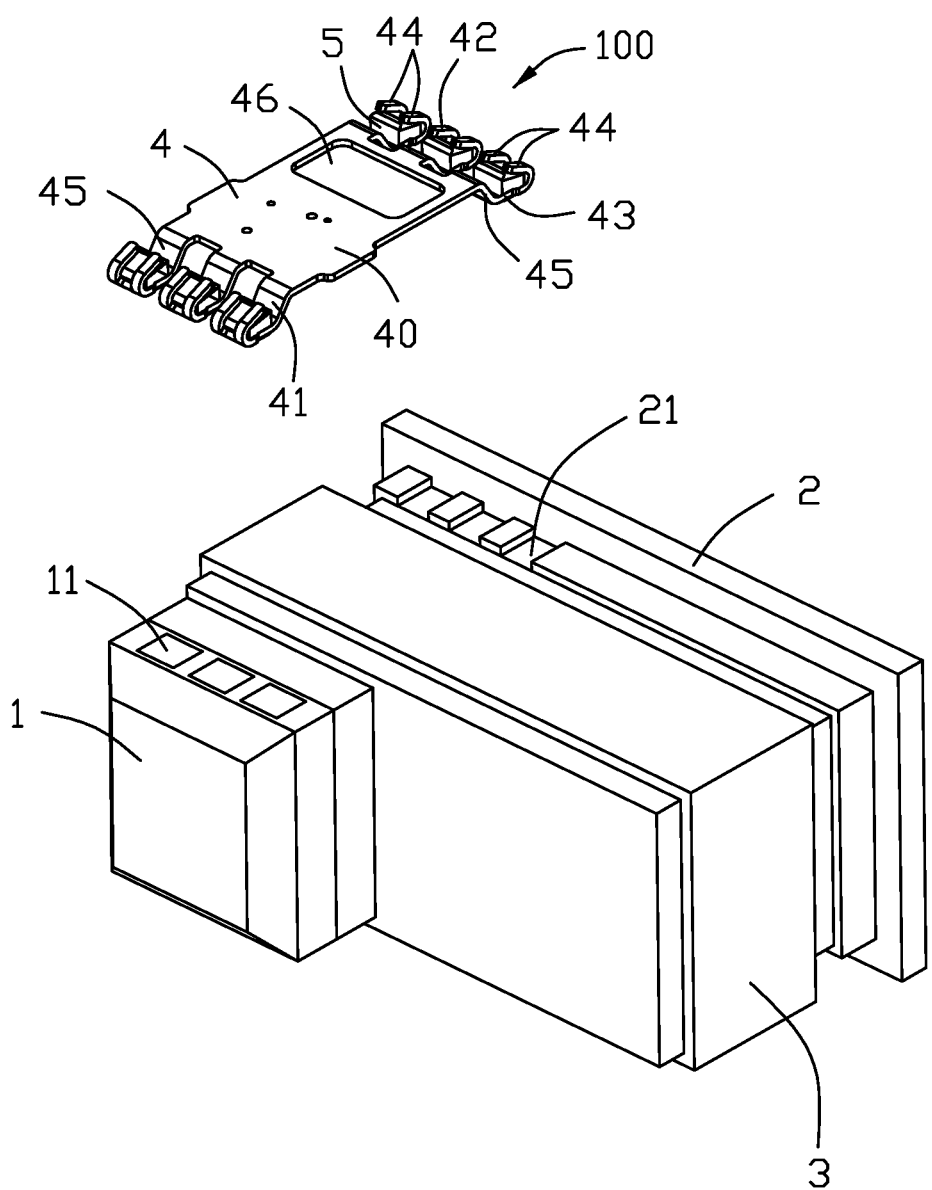
FIG. 2 is an exploded perspective view of the electronic component with the connecting part having the solder units of FIG. 1.
Figure 3:
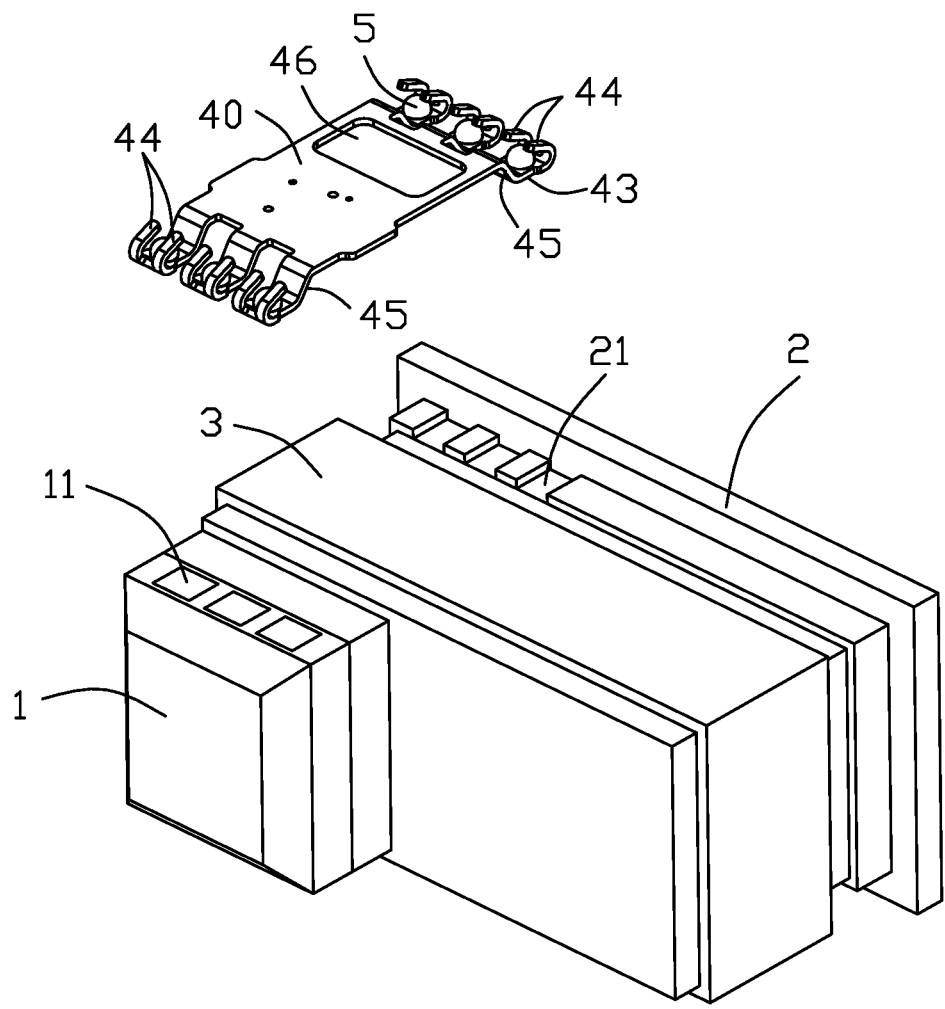
FIG. 3 is an exploded perspective view of the electronic component with the connecting part having the solder unit of FIG. 2 while without solder flux.
Figure 4:
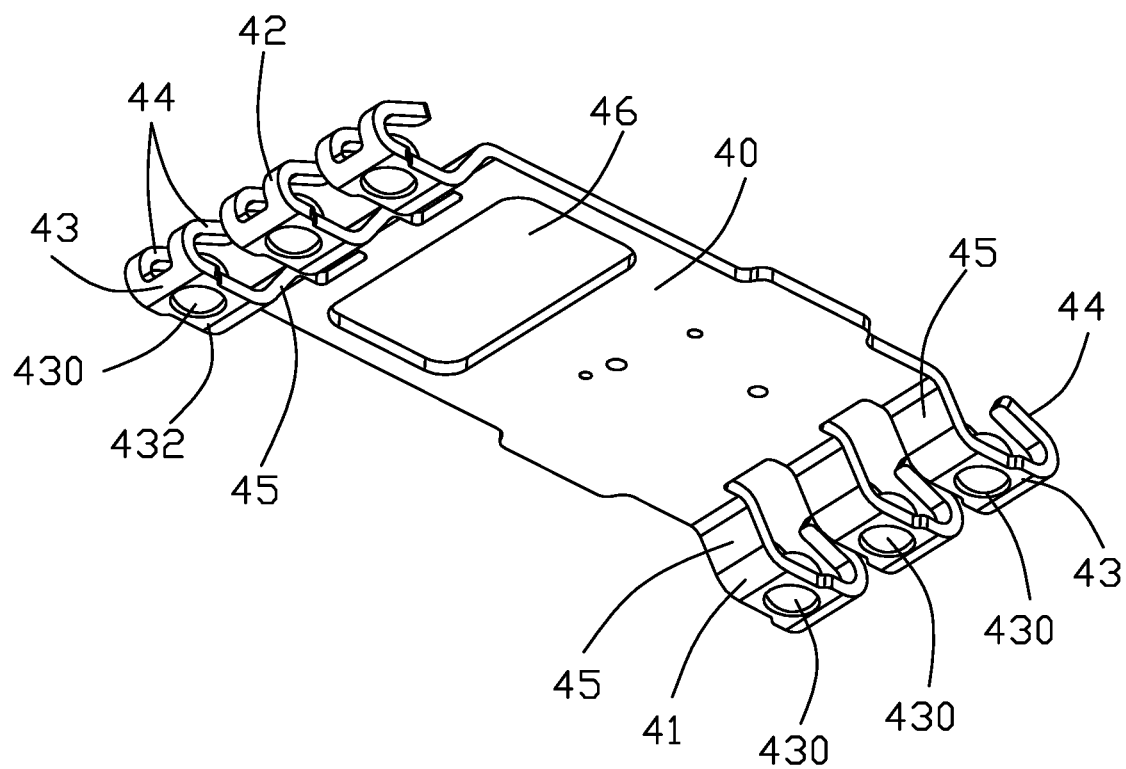
FIG. 4 is another exploded perspective view of the electronic component with connecting part having the solder unit of FIG. 3 while without the solder flux.
Figure 5:
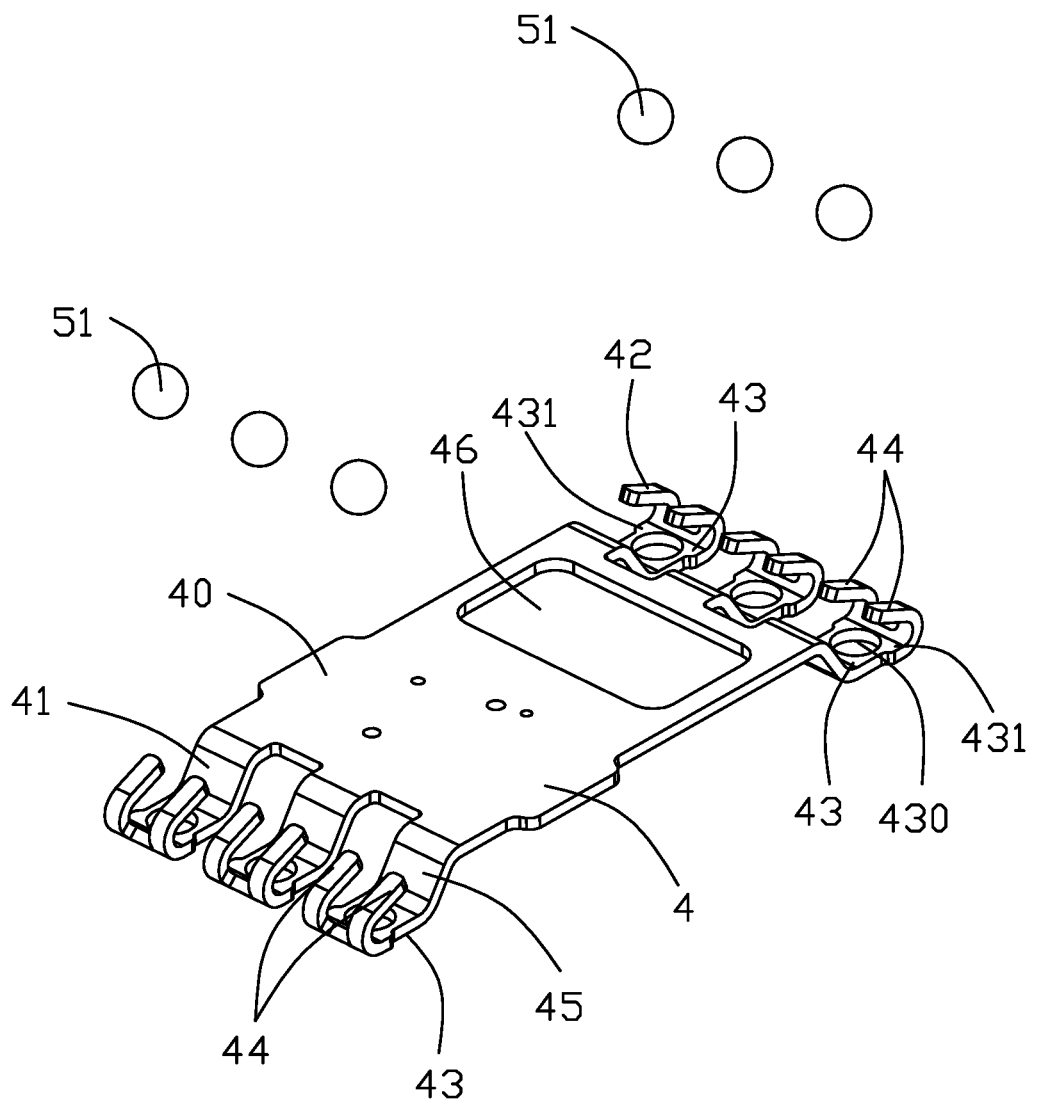
FIG. 5 is an exploded perspective view of the connecting part with the solder units.
Figure 6:
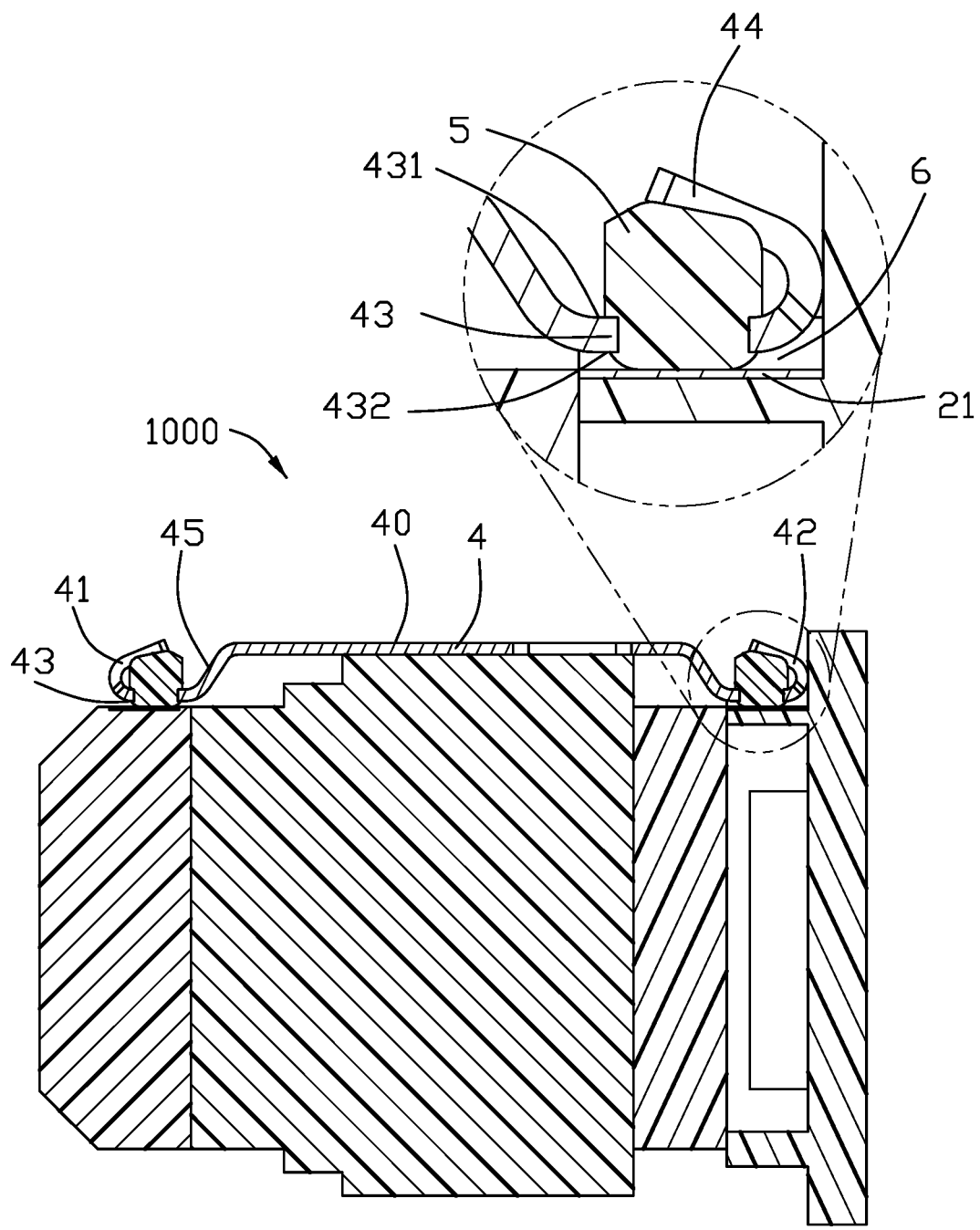
FIG. 6 is a cross-sectional view of the electronic component and the connecting part having the solder units of FIG. 1.

Referring to FIGS. 1-6, an electronic component 100 includes a first module 1, a second module 2, a third module 3 between the first module 1 and the second module 2, and a connecting part 4 equipped with the solder units 5 electrically connecting the first module 1 and the second module 2. The first module 1, the second module 2 and the third module 3 commonly form a module sub-assembly The first module 1 and the second module 2 form the first conductive pads 11 and the second conductive pads 21. The connecting part 4 includes a plate body 40, a plurality of first contact tails 41 and a plurality of second contact tails 42 respectively extending from two opposite sides of the plate body 40. The first contact tails 41 are respectively soldered upon the corresponding first conductive pads 11, and the second contact tails 42 are respectively soldered upon the corresponding second conductive pads 21.

Each of the first contact tail 41 and the second contact tail 42 include the mounting pad 43 with opposite top surface 431 and undersurface 432. A through hole 430 extends through the top surface 431 and the undersurface 432 in a vertical direction. The mounting pad 43 further includes a folded section 44 at an end edge. The solder unit 5 is disposed between the mounting pad 43 and the folded section 44 and is adapted to be melted to enter the through hole 430 to reach the corresponding conductive pad 11, 12 during a reflow process. In this embodiment, the folded section 44 extends in an angled direction so as to result in a downward force upon the corresponding solder unit 5 for clamping the solder unit 5 between the folded section 44 and the mounting pad 43. In this embodiment, the through hole 430 is circular. Alternately, the through hole 430 may horizontally extend to reach the end of the mounting pad 43 to enlarge the dimension for assuring sufficient melted solder unit 5 may reach the corresponding conductive pad 11, 12.

The plate body 40 includes a window 46 and is glued upon the third module 3. The through hole 430 is dimensioned smaller than the cross-section of the solder unit 5. The solder unit 5 extends downwardly through the through hole 430 and beyond the under surface 432 of the mounting pad 43 for reaching the corresponding conductive pad 11, 21 of the first module 1 and the second module 2. Notably, a gap 6 is formed between the undersurface 432 of the mounting pad 43 and the corresponding conductive pad 11, 21, and the melted solder unit 5 may fill the gap 6 so as to secure the mounting pad 43 upon the corresponding conductive pad 11, 21.

Notably, the solder unit 5 includes a tin body/ball or a solder core 51 coated with or enclosed by solder flux (not labeled). During reflowing, both the solder ball 51 and the flux are melted by heat or spot welding for attaching the mounting pad 43 to the conductive pad 11, 21 of the first module 1 and the second module 2. During assembling the solder unit 5 to the first and second contact tail 41, 42, the solder ball 51 is firstly positioned upon the top surface 431 of the mounting pad 43 with a portion being received within the through hole 430 wherein the bottom end of the solder unit 5 extends downwardly below the undersurface 432 of the mounting pad 43. The solder flex is successively applied upon the solder ball 51 to fill the gap between the mounting pad 43 and the solder ball 51 so as to have the total solder unit 5 is snugly clamped between the folded section 44 and the top surface 431 of the mounting pad 43. The connecting part 4 is positioned upon the stacked first module 1, second module 2 and third module 3 by applying the glue between the plate body 40 of the connecting part 4 and the third module 3, and the solder units 5 are heated to be melted to flow through the through holes 430 to reach the corresponding conductive pads 11, 21 of the first module 1 and second module 2. Therefore, the connecting part 4 can be secured to the third module 3 by glue mechanically while to the first module 1 and the second module 2 by soldering mechanically and electrically.

Notably, the contact tail 41, 42 has the connecting section 45 linked to the plate body 40 in an oblique manner so as to have the contact tail 41, 42 apply the pressure upon the first module 1 and the second module 2.

Figure 7:
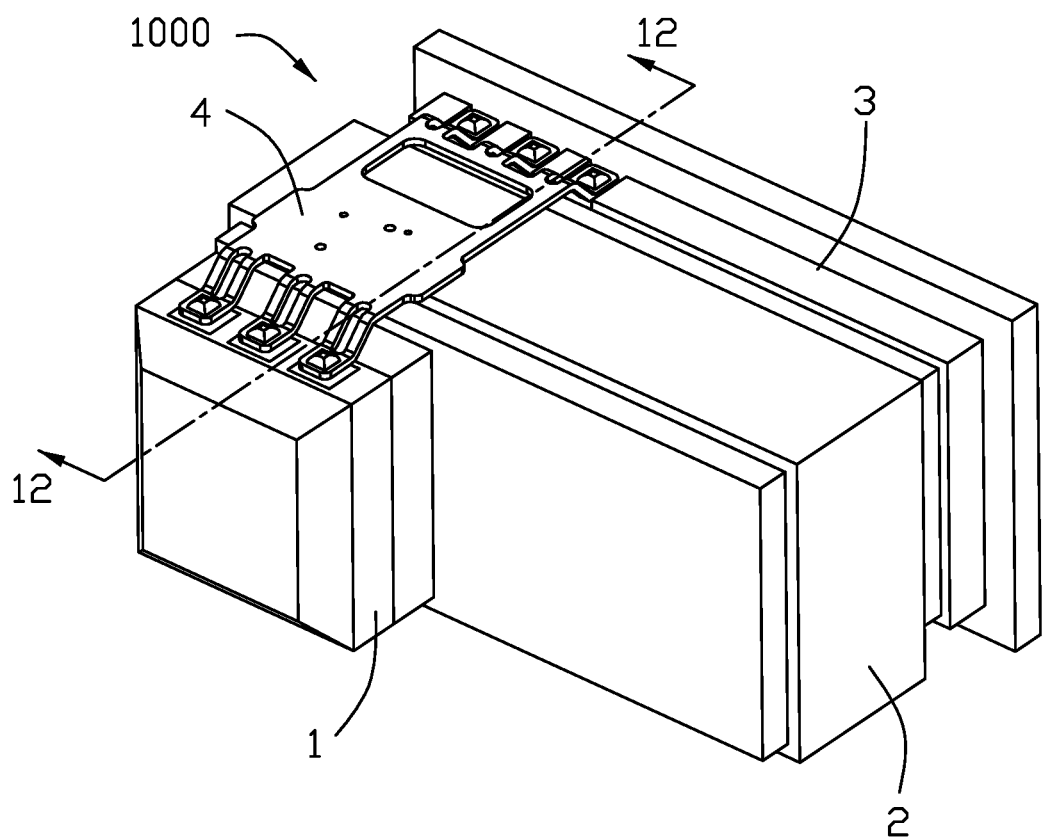
FIG. 7 is an assembled perspective view of the electronic component with the connecting parts having solder units thereon, according to the second embodiment of the invention.
Figure 8:
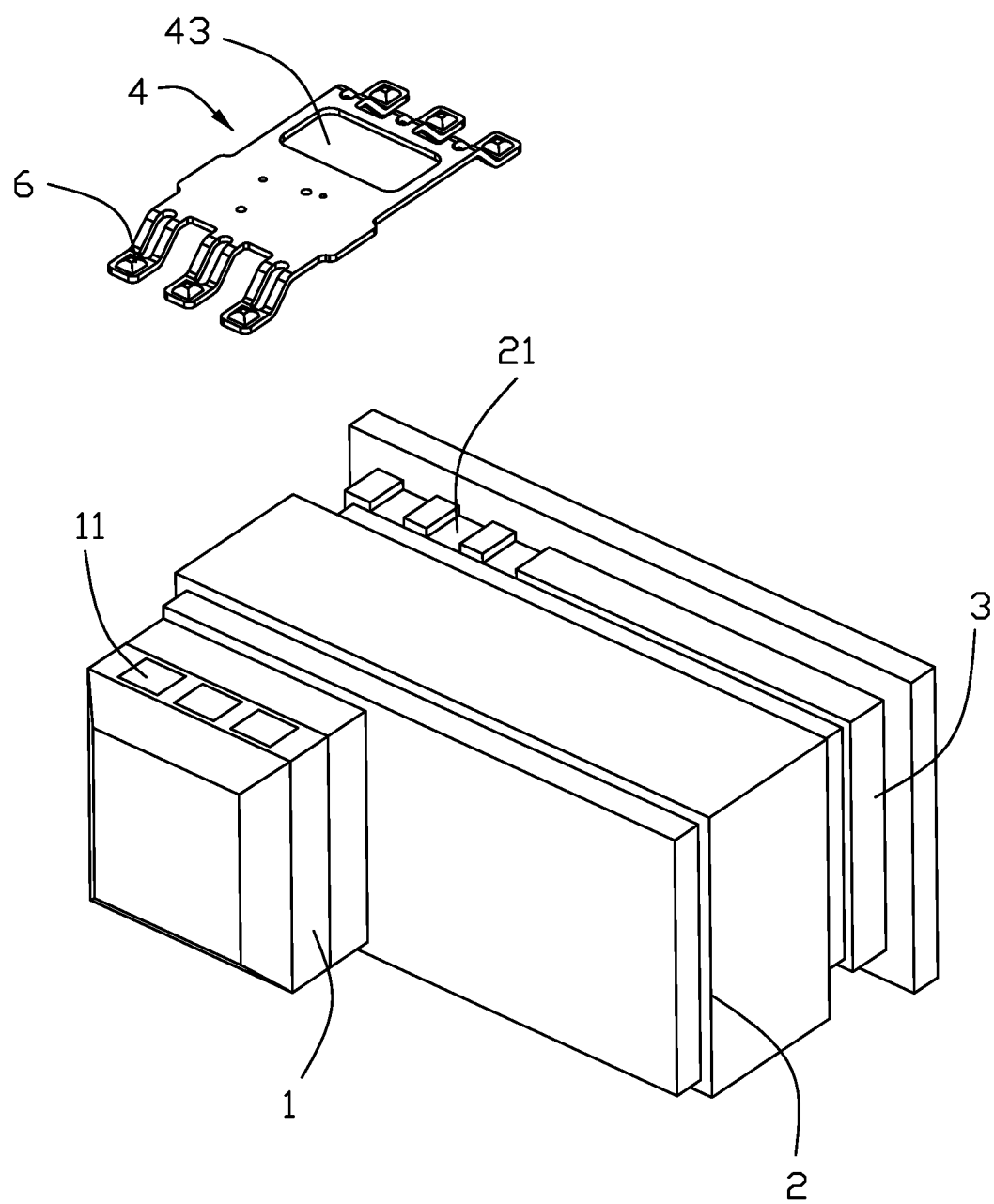
FIG. 8 is an exploded perspective view of the electronic component with the connecting part having the soldering units thereon of FIG. 7.
Figure 9:
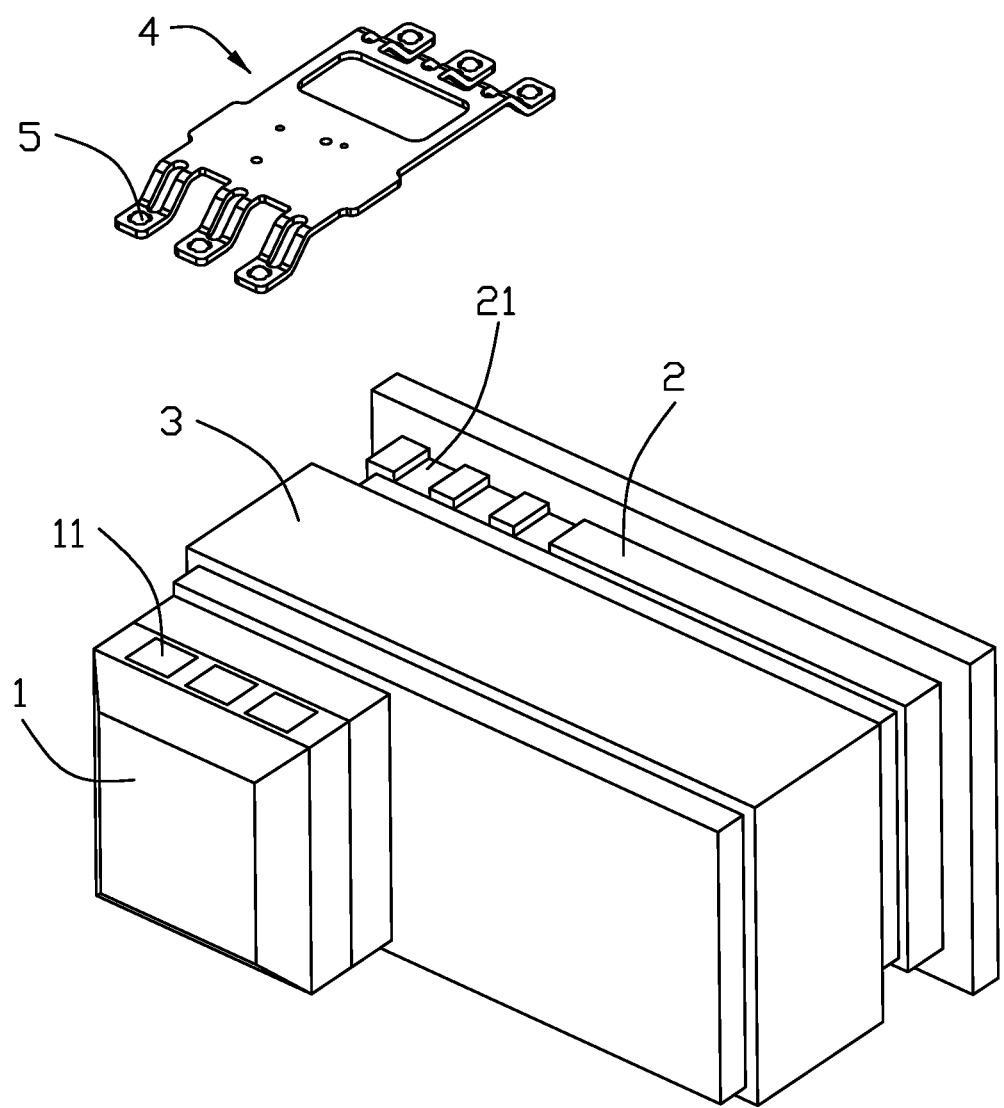
FIG. 9 is an exploded perspective view of the electronic component with the connecting part having the solder units thereon of FIG. 8 while without the solder flux.
Figure 10:
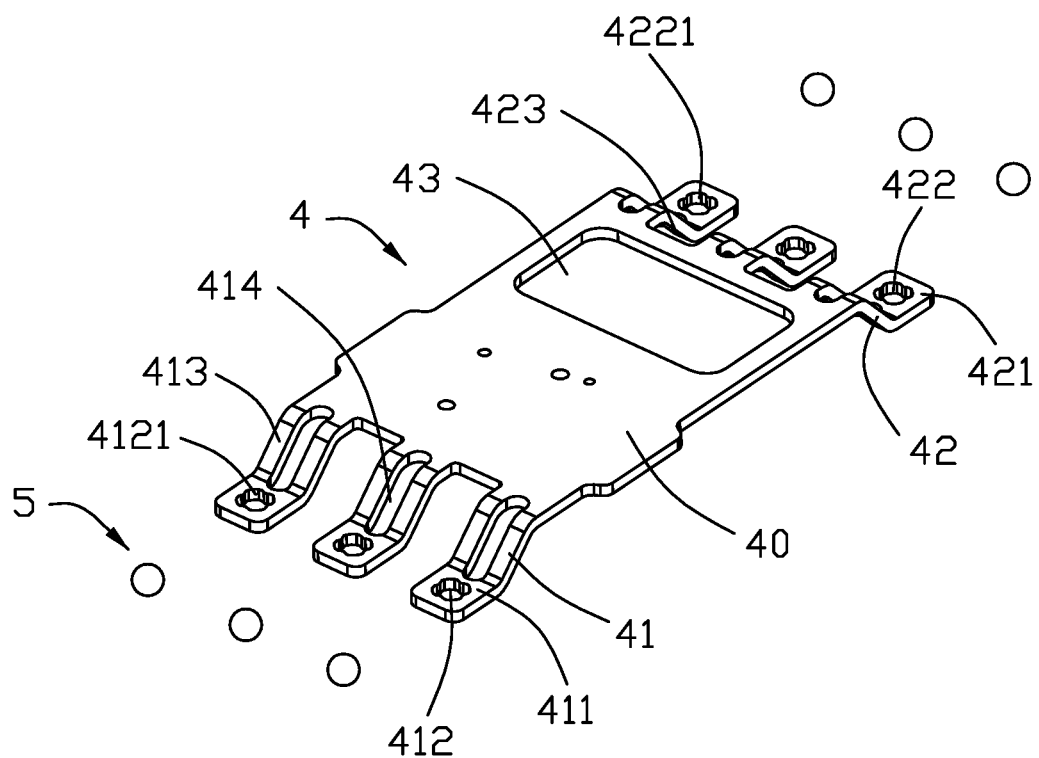
FIG. 10 is an exploded perspective view of the connecting part with the solder units of FIG. 7.
Figure 11:
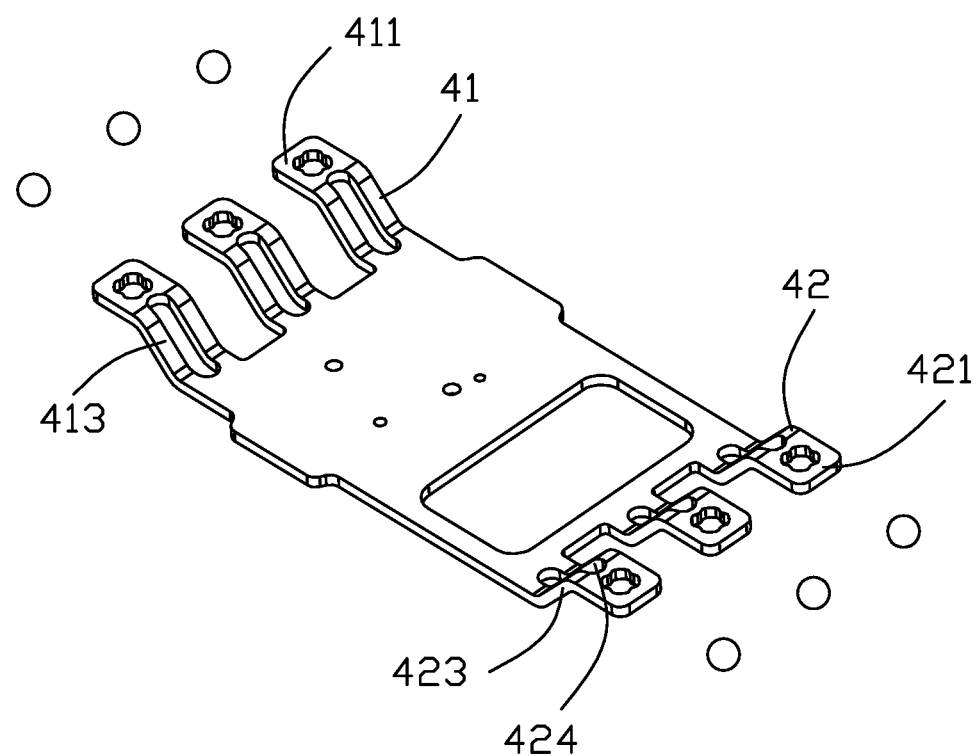
FIG. 11 is another exploded perspective view of the connecting part with the solder units of FIG. 10.
Figure 12:
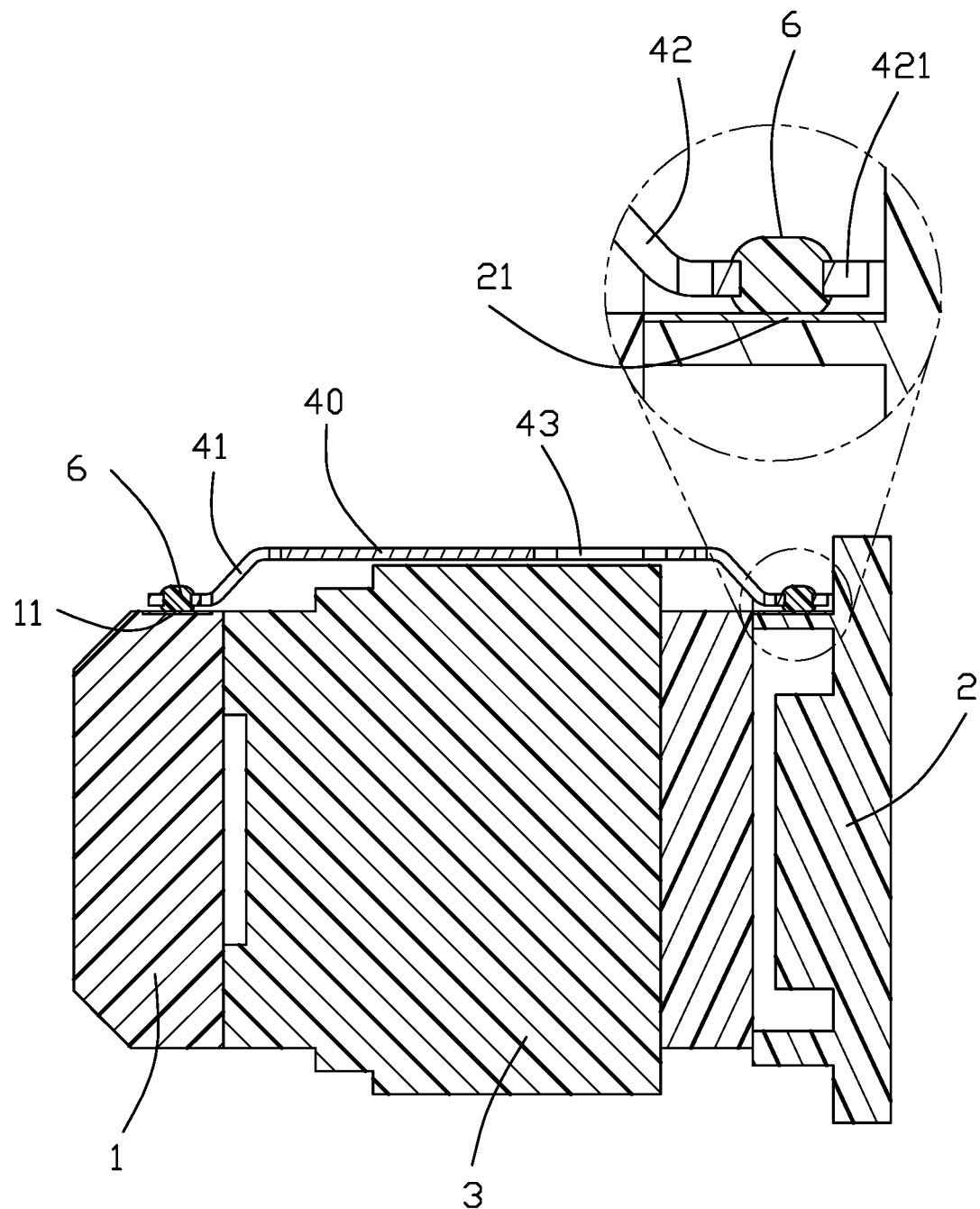
FIG. 12 is a cross-sectional view of the electronic components with the connecting part having the solder units thereon of FIG. 7.

Referring to FIGS. 7-12, similar to the first embodiment, the electron component 1000 includes a first module 1, a second module 2, a third module 3 between the first module 1 and the second module 2, and a connecting part 4 equipped with the solder units 5 electrically connecting the first module 1 and the second module 2. The first module 1 and the second module 2 form the first conductive pads 11 and the second conductive pads 21. The connecting part 4 includes a plate body 40, a plurality of first contact tails 41 and a plurality of second contact tails 42 respectively extending from two opposite sides of the plate body 40. The first contact tails 41 are respectively soldered upon the corresponding first conductive pads 11, and the second contact tails 42 are respectively soldered upon the corresponding second conductive pads 21.

The connecting part 4 further includes a window 43 and is glued to the third module 3. Each of the first contact 41 and the second contact tail 42 include the mounting pad 411, 421 with opposite top surface and undersurface (not labeled). A through hole 412, 422 of the first contact tail 41 or the second contact tail 42 extends through the top surface and the undersurface of the mounting pad 411, 421. The solder ball 5 of the solder units is secured into the through hole 412, 422 in an interference fit and adapted to be melted to be fixed to the corresponding conductive pad 11, 12 via heating or spot welding.

The first contact tail 41 and the second contact tail 42 further have the connecting section 413, 423 to connect the corresponding mounting pad 411, 421 to the plate body 40 wherein the connecting section 413, 423 are located above the third module 3. The connecting section 413, 423 further includes a slot 414, 424 linked between the plate body 40 and the mounting pad 411, 421 in order to enhance resiliency thereof for applying a pre-pressure upon the first module 1 and the second module 2. The slot 414, 424 may guide the solder ball 5 toward the through hole 412, 422 when assembling the solder ball 5 into the corresponding through hole 412, 422. In this embodiment, the through hole 412, 422 forms a plurality of recesses 4121, 4221 with corresponding neighboring protrusions (not labeled) for securing the solder ball 5 in an interference fit. Each solder unit includes an inner solder ball 5 and a layer of solder flux 6 so as to secure the mounting pad 411, 421 to the corresponding conductive pad 11, 21. The solder flux 6 covers the solder ball 5 and fills the gap between the solder ball 5 and the through hole 412, 422 and a portion around the through hole 412, 422 on both the top surface and the undersurface of the mounting pad 411, 421.

During assembling, the solder balls 5 are firstly assemble within the corresponding through holes 412, 422 and the solder fluxes 6 are applied upon the solder balls 5. The plate body 40 of the connecting part 4 is glued to the third module 3, and the mounting pads 411, 421 are secured to the corresponding conductive pads 11, 21 by the melted solder units, which includes the solder balls 5 and the associated solder fluxes 6, extending through the corresponding through holes 412, 422.

Figure 13:
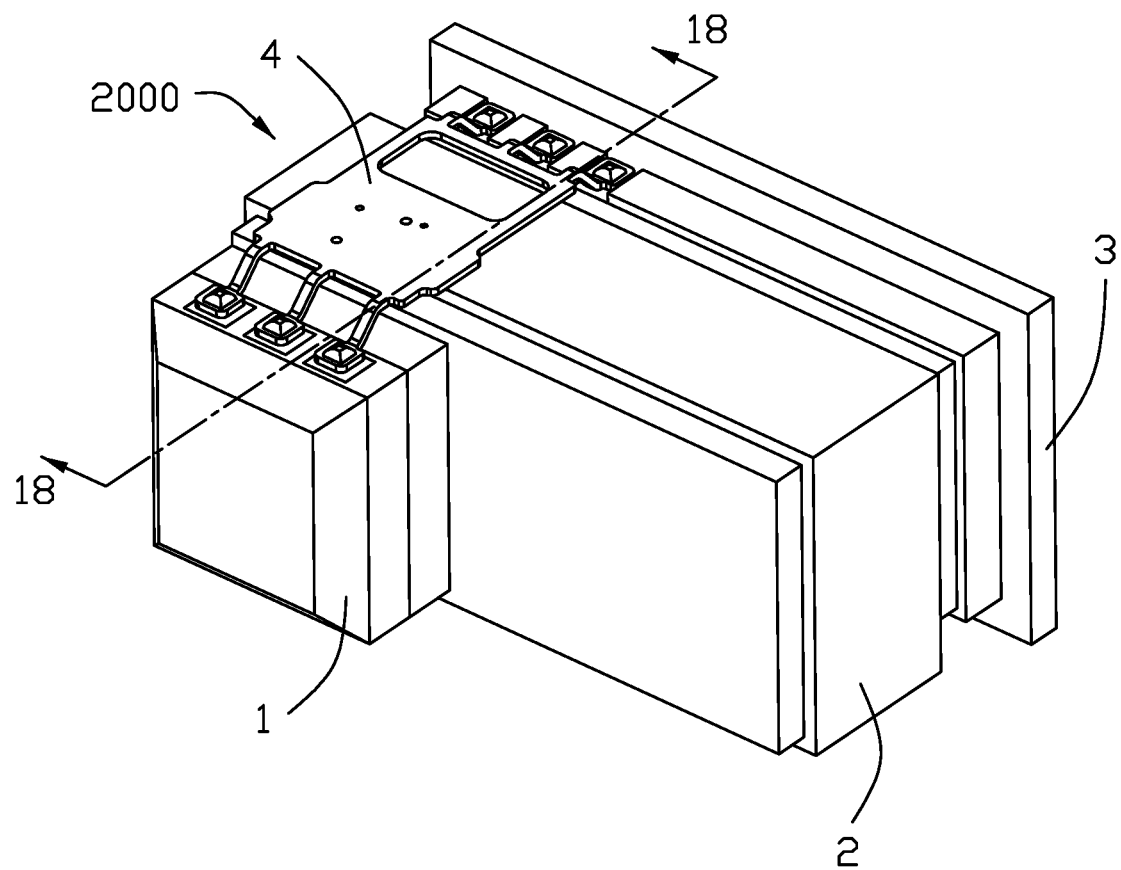
FIG. 13 is an assembled perspective view of the electronic component with the connecting part having soldering units thereon, according to a third embodiment of the invention.
Figure 14:
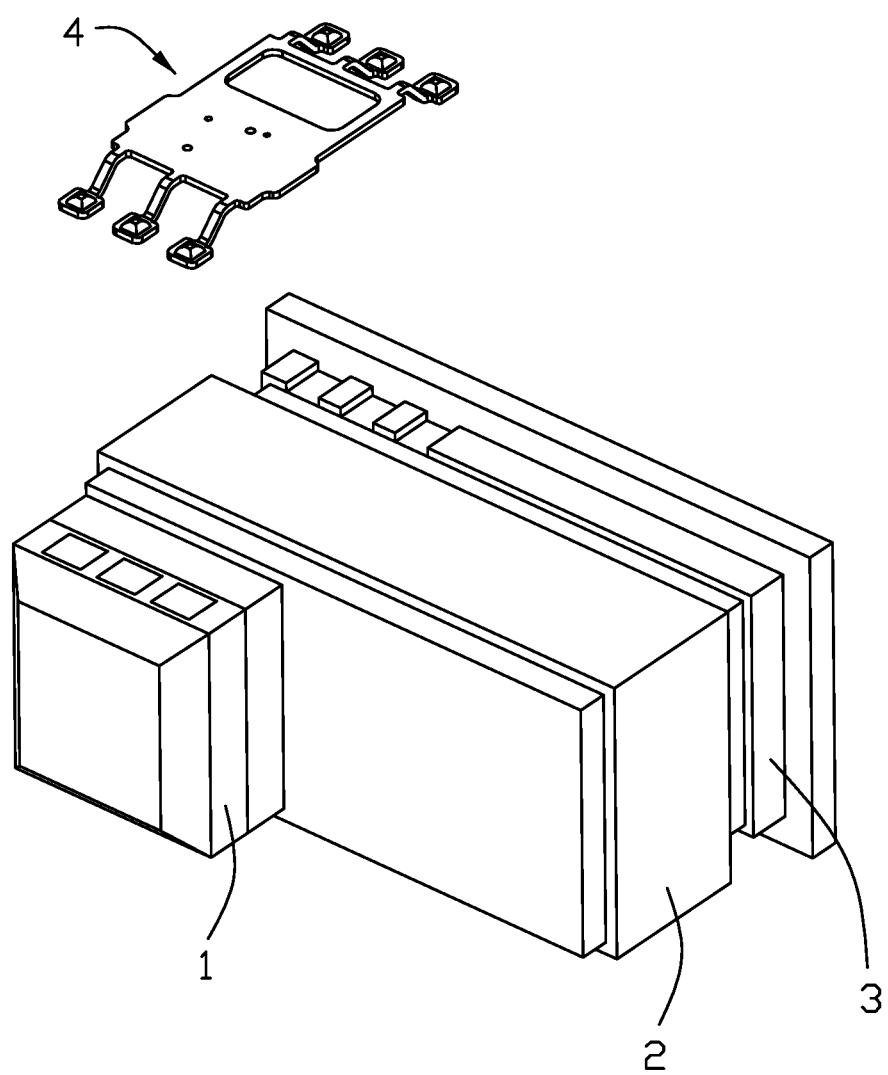
FIG. 14 is an exploded perspective view of the electronic component with the connecting part having the soldering units thereon of FIG. 13.
Figure 15:
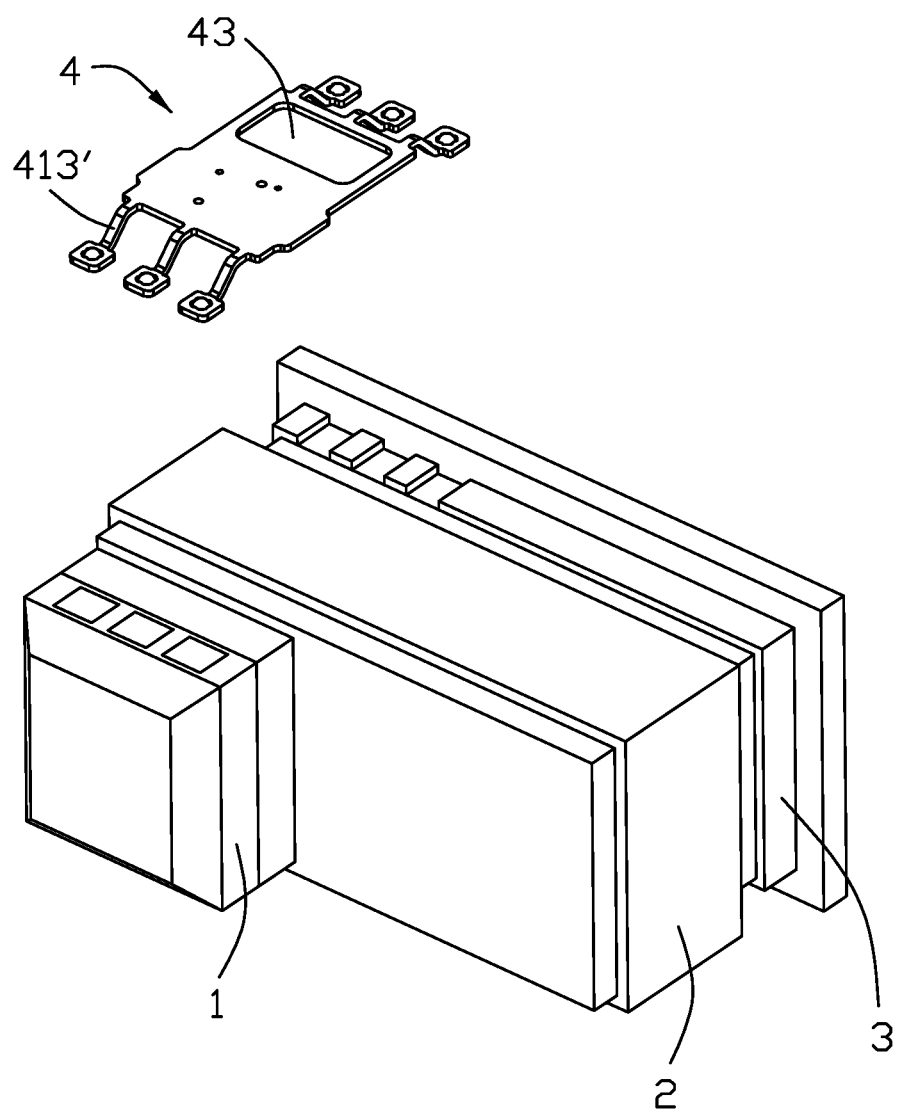
FIG. 15 is an exploded perspective view of the electronic component with the connecting part having the solder units thereon of FIG. 14 while without the solder flux.
Figure 16:
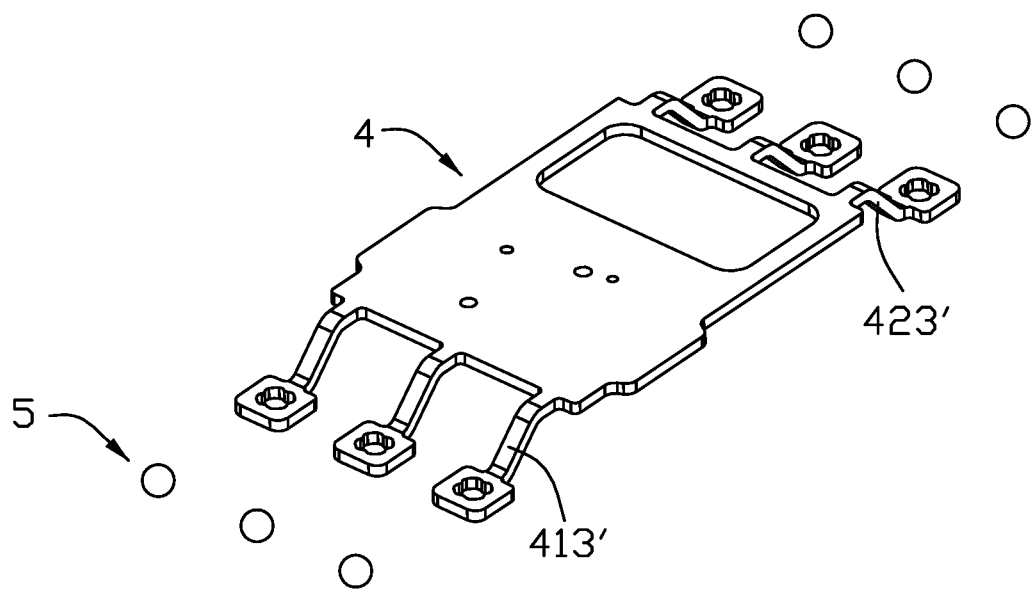
FIG. 16 is an exploded perspective view of the connecting part with the solder units of FIG. 13.
Figure 17:
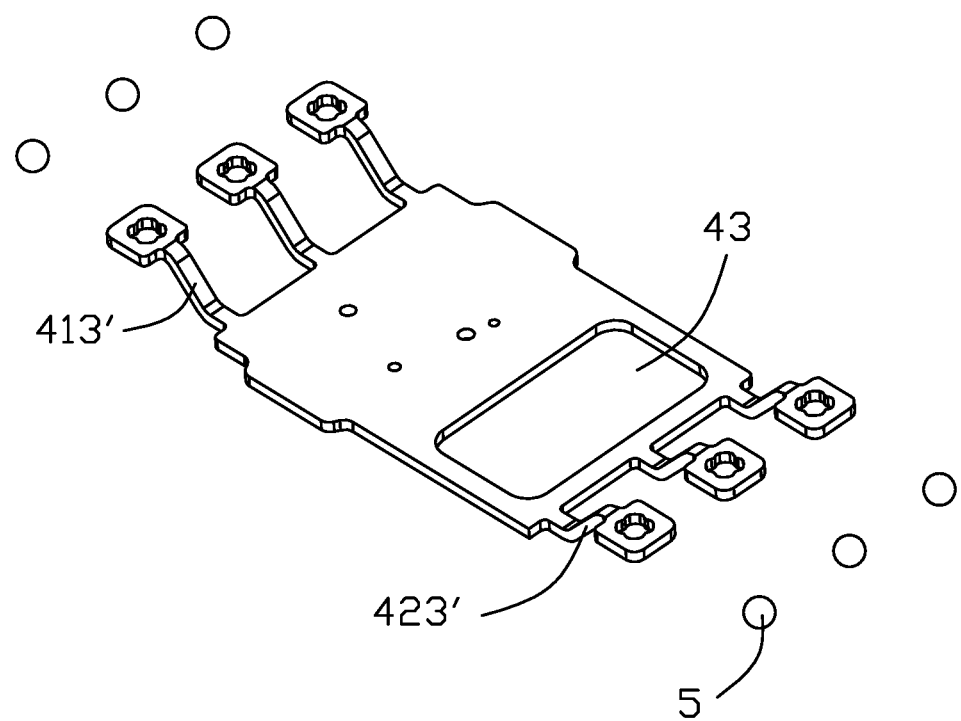
FIG. 17 is another exploded perspective view of the connecting part with the solder units of FIG. 16.
Figure 18:
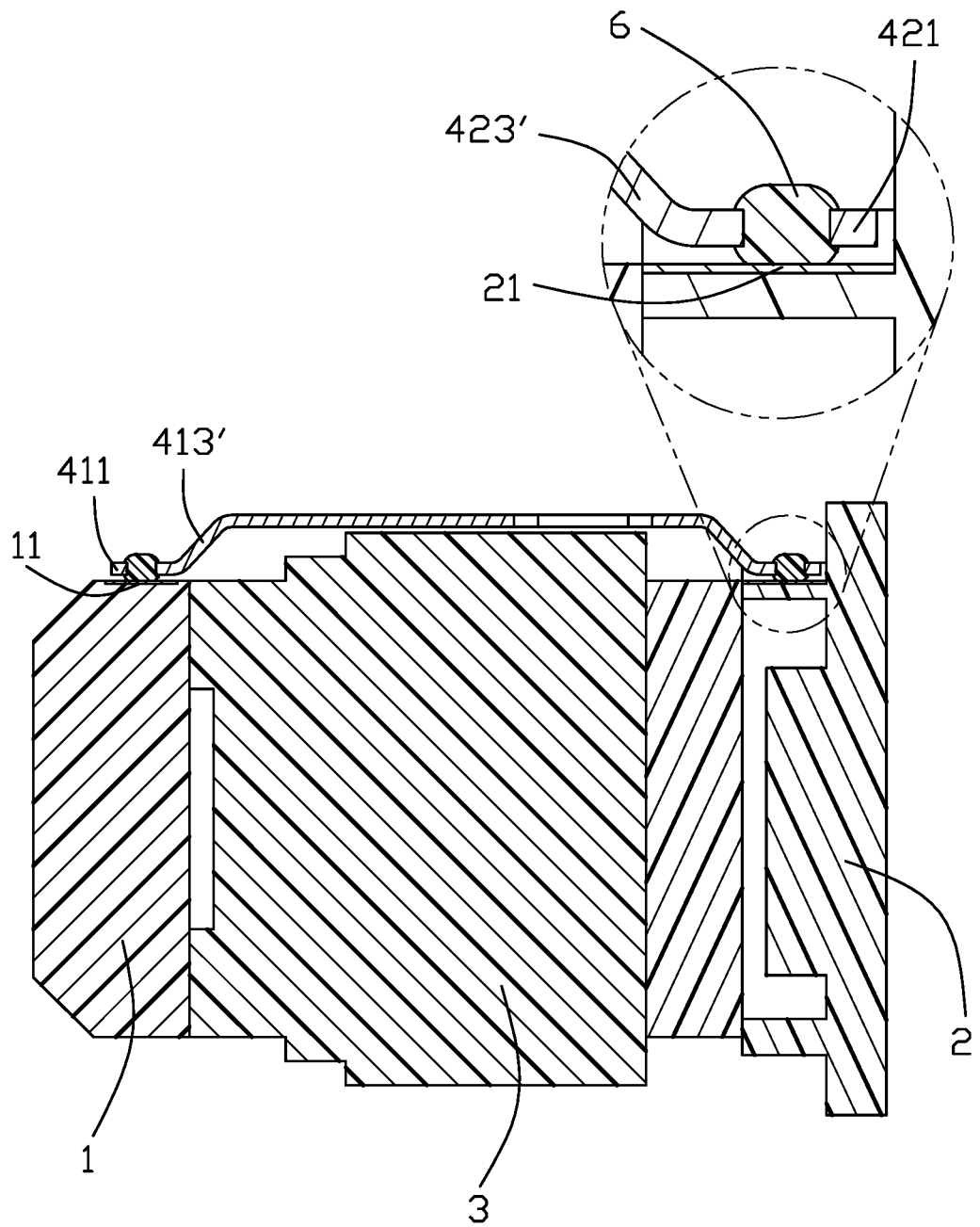
FIG. 18 is a cross-sectional view of the electronic components with the connecting part having the solder units thereon of FIG. 13.

FIGS. 13-18 show the third embodiment having the electronic component 2000 which differs from the electronic component 1000 with the connecting section 413', 423' is relatively narrow without the slot 414, 424 therein. Understandably, the connecting section 413', 423' also has resiliency for providing the pre-pressure upon the first module 1 and the second module 2.

What is claimed is:
1. An electronic component comprising:
a module sub-assembly including at least a first module a second module, the first module forming a plurality of first conductive pads, the second module forming a plurality of second conductive pads;
a connecting part including a body and a plurality of contact tails on two sides of the body to be respectively soldered upon the first conductive pads and the second conductive pads, respectively;

each of said contact tails including a mounting pad defining opposite top surface and undersurface with a through hole extending therethrough in a vertical direction; and
a plurality of solder units each secured to the corresponding mounting pad before a reflow process, and filling the corresponding through hole after the reflow process and extending below the undersurface to secure the mounting pad and the conductive pad together; wherein before the reflow process, the solder unit is located upon the top surface of the mounting pad and grasped by a folded section of the mounting pad.

2. The electronic component as claimed in claim 1, wherein said folded section extends obliquely.

3. The electronic component as claimed in claim 1, wherein the solder unit enters the corresponding through hole in an interference fit before the reflow process.

4. The electronic component as claimed in claim 1, wherein the contact tail has a connecting section linked between the body and the mounting pad, and said connecting section extends in an oblique direction.

5. The electronic component as claimed in claim 1, further includes a third module sandwiched between the first module and the second module, wherein the body of the connecting part is fixed to the third body.

6. The electronic component as claimed in claim 1, wherein the through hole is smaller than a cross-section of the solder unit.

7. The electronic component as claimed in claim 3, wherein there are a plurality of recesses and corresponding protrusions on a periphery of the through hole.

8. The electrical component as claimed in claim 4, wherein a slot is formed in the connecting section.

9. The electronic component as claimed in claim 5, wherein the connecting part is mechanically connected to the third module while is mechanically and electrically connected to the first module and the second module.

10. A method of making mechanical and electrical connection between a connecting part and a module sub-assembly, comprising steps of:
providing a plurality of contact tails on the connecting part, each of said contact tails including a mounting pad with opposite top surface and undersurface and a through hole extending therethrough in a vertical direction;
providing a plurality of conductive pads on the module sub-assembly;
fixing a plurality of solder units on the mounting pads, respectively;
reflowing the solder units to have the melted solder units extend downwardly through the corresponding through holes beyond the undersurfaces of the mounting pads and secured to the corresponding conductive pads; wherein
the mounting pad includes a folded section to clamp the solder unit for fixing the soldering unit thereto.

11. The method as claimed in claim 10, wherein the solder unit is received within the through hole in an interference fit before reflowing.

12. The method as claimed in claim 10, wherein a horizontal dimension of the through hole is smaller than a cross-section of the solder unit.

13. The method as claimed in claim 10, wherein each of the contact tails includes a connecting section linked to the mounting pad, and said connecting section extends obliquely.

14. The method as claimed in claim 10, wherein the module sub-assembly includes a first module and a second module sandwiching a third module therebetween, and the contacting part is mechanically and electrically connected to both the first module and the second module while is only mechanically connected to the third module.

15. An electronic component comprising:
a module sub-assembly having a plurality of conductive pads thereon;
a metallic connecting part including a plate body and a plurality of contact tails at least on one side, each of the contact tails including a mounting pad with opposite top surface and undersurface in a vertical direction, and further with a through hole extending therethrough in the vertical direction;
a plurality of solder units fixed to the corresponding contact tails, respectively, and located at least in alignment with and above the corresponding through hole; wherein
the solder unit is melted to extend through the through hole and beyond the undersurface of the mounting pad for securing to the corresponding conductive pad; wherein
the mounting pad is further equipped with a folded section to clamp the corresponding solder unit toward the mounting pad.

16. The electronic component as claimed in claim 15, wherein the through hole forms a plurality of recesses and protrusions for retain the solder unit in an interference fit before a reflow process.

17. The electronic component as claimed in claim 15, wherein a horizontal dimension of the through hole is smaller than a cross-sectional of the solder unit.

* * * * *